(12) United States Patent
Golick

(10) Patent No.: US 7,009,282 B2
(45) Date of Patent: Mar. 7, 2006

(54) PACKAGED INTEGRATED CIRCUIT PROVIDING TRACE ACCESS TO HIGH-SPEED LEADS

(75) Inventor: Lawrence W. Golick, Nazareth, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/672,495

(22) Filed: Sep. 26, 2003

(65) Prior Publication Data

US 2005/0067677 A1    Mar. 31, 2005

(51) Int. Cl.
*H01L 23/495* (2006.01)
*H01L 23/48* (2006.01)
*H01L 23/52* (2006.01)

(52) U.S. Cl. ............... 257/666; 257/676; 257/690; 257/692; 257/698; 257/728

(58) Field of Classification Search ............... 257/666, 257/672, 674, 669, 670, 676, 693, 690, 698, 257/728, 692

See application file for complete search history.

(56) References Cited

U.S. PATENT DOCUMENTS

| | | | | |
|---|---|---|---|---|
| 4,989,066 A | * | 1/1991 | Sumi | 257/692 |
| 5,233,220 A | * | 8/1993 | Lamson et al. | 257/666 |
| 5,376,909 A | * | 12/1994 | Nelson et al. | 333/247 |
| 5,414,299 A | * | 5/1995 | Wang et al. | 257/702 |
| 6,060,768 A | * | 5/2000 | Hayashida et al. | 257/666 |
| 6,121,690 A | * | 9/2000 | Yamada et al. | 257/784 |
| 6,355,502 B1 | | 3/2002 | Kang et al. | |
| 6,448,633 B1 | * | 9/2002 | Yee et al. | 257/666 |
| 6,476,478 B1 | | 11/2002 | Swiss et al. | |
| 6,559,524 B1 | * | 5/2003 | Seko | 257/673 |
| 6,586,677 B1 | | 7/2003 | Glenn | |
| 6,586,826 B1 | | 7/2003 | Glenn et al. | |
| 6,597,059 B1 | | 7/2003 | McCann et al. | |
| 6,713,850 B1 | * | 3/2004 | Yuan et al. | 257/668 |
| 2002/0066943 A1 | | 6/2002 | Tan et al. | |

* cited by examiner

Primary Examiner—Nitin Parekh

(57) ABSTRACT

A packaged integrated circuit for installation on a printed wiring board (PWB) or other type of circuit mounting structure, that allows for the routing of high-speed signals out from high-speed leads on an underside of the packaged integrated circuit. The packaged integrated circuit comprises a die and a package body formed from encapsulant that at least partially encloses the die. A leadframe is also connected to the die and partially enclosed in the package body. Leads extend out from the package body and a subset of these leads are separated by a lead-to-lead pitch. At least two adjacent leads of the leadframe are separated by a space larger than the pitch. An additional lead is also connected to the die and disposed on an underside of the package. The additional lead is connectable to a circuit mounting structure trace passing between the adjacent leads separated by the space larger than the pitch.

20 Claims, 3 Drawing Sheets

PACKAGED INTEGRATED CIRCUIT PROVIDING TRACE ACCESS TO HIGH-SPEED LEADS

FIELD OF THE INVENTION

The present invention relates generally to integrated circuits, and more particularly to integrated circuit packages and packaging techniques.

BACKGROUND OF THE INVENTION

With the continued anticipation of higher speed requirements in the computer hard drive industry, a transition from Parallel Advanced Technology Attachment (PATA) interfaces to Serial Advanced Technology Attachment (SATA) interfaces is currently underway. See, e.g., J. Donovan, "Here Comes Serial ATA," E. E. Times, April 2003; and L. Wood, "SATA: Evolutionary or Revolutionary Disk Technology," EnterpriseStorageForum.com, March 2003. SATA meets the rising hard drive performance requirements without significant increases in price. Further, SATA improves airflow and cuts power consumption by replacing PATA ribbon cables with low voltage serial cables. A SATA interface is typically integrated in a System-on-Chip (SOC) configuration. Such SOCs are frequently utilized in desktop computers. Due to extreme cost pressure in the industry, package solutions for SOCs that offer the right level of performance, while having the lowest cost, will be sought for use in the higher speed systems. Thus, the increased performance demands of the systems have not stopped production and use of traditional leadframe-based packaging. Recent innovations have allowed the more traditional package structures to reach into the markets of the more demanding applications. See, e.g., S. Jewler, "Current Challenges Dictated by Today's IC Packaging Trends," Solid State Technology, April 2003.

A standard SOC is a Thin Quad Flat Package (TQFP) which provides a space efficient packaging solution, resulting in smaller PWB space requirements. The TQFP includes a central die upon which an integrated circuit device is disposed. The central die is electrically connected to a plurality of leads that extend outward from the die and beyond the packaging, or the material which encapsulates the die and the leads. The ends of the leads may then be soldered to traces on a PWB. The reduced height and body dimensions of the TQFP are ideal for space-constrained applications, such as laptop PCs, video/audio devices, data acquisition devices, office equipment, disc drives, and communication boards.

A preferred SOC package is the Exposed Pad Thin Quad Flat Package (ETQFP). A more particular example of such a package is the ExposedPad L/TQFP commercially available from Amkor Technology of West Chester, Pa., U.S.A. In this type of package, the integrated circuit die is shifted downward and an associated die pad is exposed on the underside of the package. The exposed die pad significantly increases the thermal efficiency of the package. The ETQFP can increase heat dissipation by as much as 110% over a standard TQFP, thereby expanding operating parameter margins. Additionally, the exposed pad can be connected to ground, thereby reducing loop inductance for high-frequency applications. The exposed pad is soldered directly to the PWB to realize the thermal and electrical benefits.

An additional product also available from Amkor Technology is the MicroLeadFrame, which replaces all the traditional leadframe leads on the perimeter of the integrated circuit package with lands on an underside of the package. The lands are used to provide electrical connection of the integrated circuit package to the PWB. This modification allows package size to be reduced, while also reducing lead inductance for high-frequency applications. This technology also incorporates the exposed pad on the bottom surface of the package to provide an efficient heat path.

The adaptation of these packages is intended to extend the useful life of the low-cost TQFP, so that it may comply with anticipated higher speed requirements of the systems, while remaining inexpensive. However, a problem exists in that users generally prefer a circuit board arrangement having high-speed lines that may be routed to an integrated circuit on a top surface of a PWB, while maintaining the traditional properties of TQFPs, such as leadframe leads. Conventional TQFPs, including the above-noted ETQFP, typically do not include high-speed leads, and instead have leadframe leads with a tight pitch preventing trace access to the underside of the packaged integrated circuit from the top surface of the PWB. The MicroLeadFrame is smaller in size than traditional TQFPs and does not provide leadframe leads. Thus, a need exists for an improved package that addresses the drawbacks of the conventional arrangements.

SUMMARY OF THE INVENTION

The present invention in accordance with one aspect thereof provides a packaged integrated circuit that allows for the routing of high-speed signals out from high-speed leads on an underside of the packaged integrated circuit, across the top surface of a PWB or other type of circuit mounting structure, to a high-speed connector on the circuit mounting structure.

For example, one aspect of the invention is a packaged integrated circuit comprising a die. A package body is formed from encapsulant and at least partially encloses the die. A leadframe is also connected to the die and partially enclosed in the package body. Leads extend out from the package body and a subset of these leads are separated by a lead-to-lead pitch. At least two adjacent leads of the leadframe are separated by a space larger than the pitch. An additional lead, not part of the lead frame, is also connected to the die and disposed on an underside of the package. The additional lead is connectable to a PWB trace or other circuit mounting structure trace passing between the adjacent leads separated by the space larger than the pitch.

The present invention may further comprise a PWB, or other type of circuit mounting structure, having at least one electrical connector, a plurality of traces, and at least one packaged integrated circuit, as described above, mounted thereon. At least one trace is routed on the top surface of the circuit mounting structure, from the electrical connector, passing between the adjacent leads separated by the space larger than pitch, to an additional lead on the underside of the packaged integrated circuit.

The present invention may also comprise a leadframe for use in a packaged integrated circuit having a plurality of leads. At least two adjacent leads of the leadframe are separated by a space larger than the pitch, so that when the leadframe is used in a packaged integrated circuit, a trace on a circuit mounting structure is connectable to an additional lead on an underside of the package body.

Advantageously, the packaged integrated circuit allows high-speed traces to be routed on a top surface of a circuit mounting structure, through the space that is larger than the pitch, to the exposed surface of the additional lead. Additionally, such an arrangement may extend the useful life of a low-cost package solution by allowing it to be incorporated into systems that have higher speed requirements.

These and other objects, features, and advantages of the present invention will become apparent from the following detailed description of illustrative embodiments thereof, which is to be read in connection with the accompanying drawings.

DETAILED DESCRIPTION OF THE PREFERRED EMBODIMENTS

As will be illustrated in detail below, the present invention in an illustrative embodiment provides a packaged integrated circuit that allows for the routing of high-speed signals out from high-speed leads on an underside of the packaged integrated circuit. The high-speed signals may then be routed across a top surface of a PWB, or other type of circuit mounting structure, to a high-speed connector.

Figure 1:
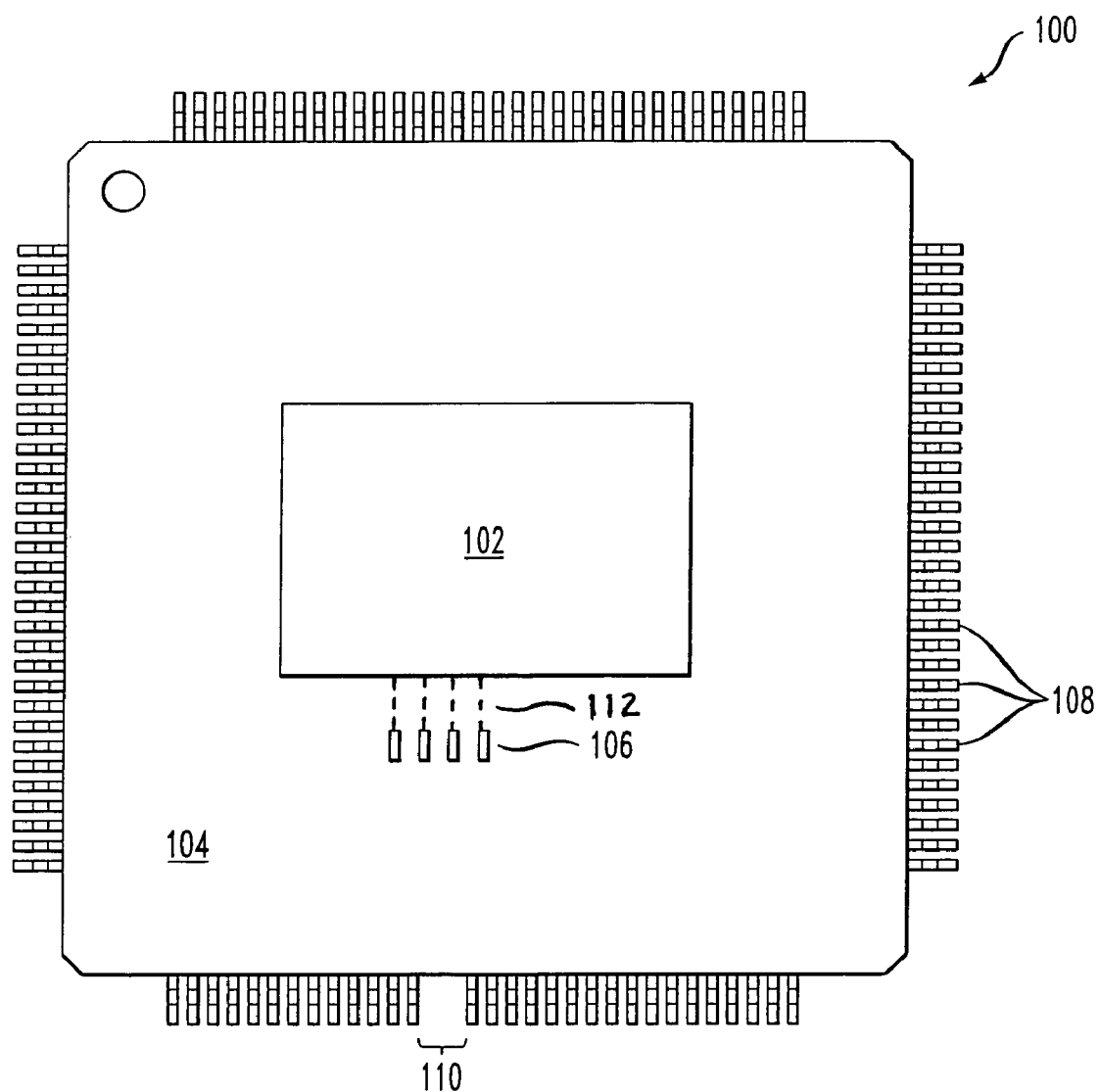
FIG. 1 is a diagram illustrating a bottom view of a packaged integrated circuit, according to an embodiment of the present invention.

Referring initially to FIG. 1, a diagram illustrates a bottom view of a packaged integrated circuit 100, according to an embodiment of the present invention.

Packaged integrated circuit 100 is suitable for mounting on a PWB or other type of circuit mounting structure. It will be assumed for the remaining description that the circuit mounting structure in the illustrative embodiment is a PWB.

At the center of packaged integrated circuit 100 is a die 102. Die 102 generally includes at least one integrated circuit device. Packaged integrated circuit 100 comprises a package body 104, formed from encapsulant. Die 102 is substantially surrounded by package body 104, but a portion of its bottom surface is exposed through the bottom surface of package body 104. Additional leads 106 are also substantially surrounded by package body 104, with portions of additional leads 106 exposed through the bottom surface of package body 104. Additional leads 106 are electrically connected to the integrated circuit device within package body 104. Die 102 significantly increases the thermal efficiency of packaged integrated circuit 100 and may be connected to ground, reducing loop inductance for high-frequency applications. In such a case, die 102 is soldered directly to a PWB, to realize the thermal and electrical benefits. While the present embodiment shows die 102 exposed on the bottom surface for thermal purposes, it is also possible to have a packaged integrated circuit without an exposed die 102. In such a case die 102 would be completely surrounded by package body 104 and would not be visible when viewing packaged integrated circuit 100.

Additional leads 106 are preferably disposed on an underside of packaged integrated circuit 100 a short distance from die 102 so that they have the shortest trace length from the integrated circuit device. Additional leads 106 are connected to die 102 in a conventional manner, preferably through wire bonds 112. The shorter the trace length, the lower the lead inductance, and the higher the speed that may be achieved at additional leads 106. In the present embodiment, four additional leads 106 are disposed on a single side of die 102. However, any number of additional leads 106 may be disposed on any or all of the sides of die 102. Further, while it is preferable for additional leads 106 to be disposed adjacent to die 102, they may be disposed anywhere on the underside of packaged integrated circuit 100. However, the shortest distance from die 102 is most preferable due to the reasons specified above.

Figure 2A:
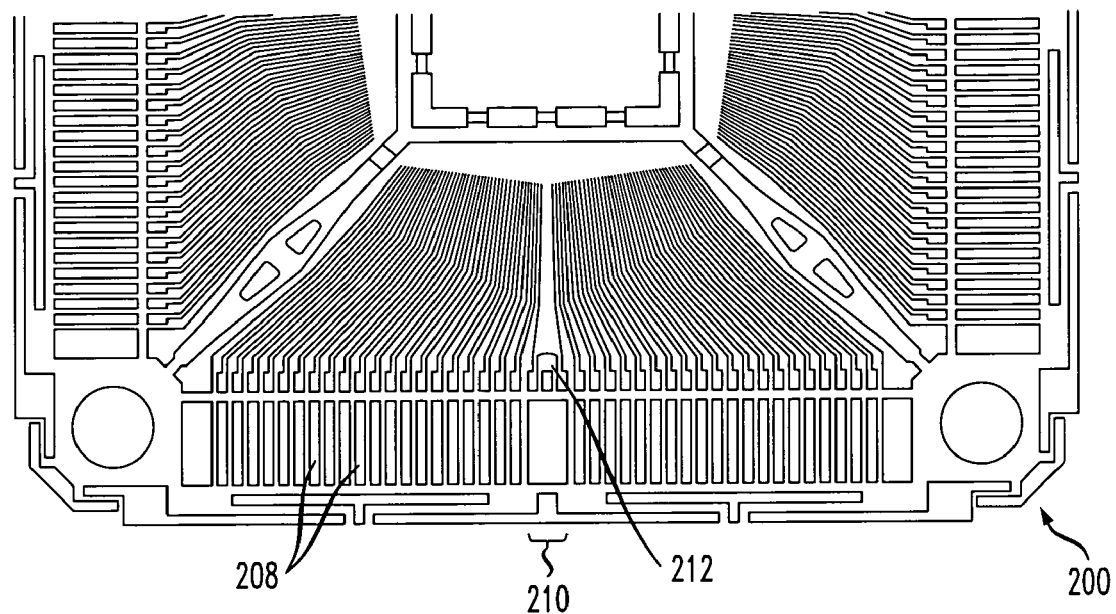
FIG. 2A is a diagram illustrating a partial view of a leadframe for an integrated circuit, according to an embodiment of the present invention.

In the illustrative embodiment of FIG. 1, leadframe leads 108 run through and project out from package body 104 along the perimeter of packaged integrated circuit 100. This is similar to a traditional TQFP arrangement. However, the invention can be implemented using a wide variety of other packaging arrangements. Leadframe leads 108 are formed and shaped from a leadframe, an example of which is shown in FIG. 2A. Leadframe leads 108 are also electrically connected to the integrated circuit device mounted on die 102 within package body 104. This electrical connection is preferably implemented using a wire bonding technique.

The spacing between leadframe leads 108 at the perimeter of packaged integrated circuit 100 is defined as the pitch. For example, the pitch of leadframe leads 108 in the illustrative embodiment may be approximately 0.4 mm to 0.5 mm. Other lead pitches may be used in alternative embodiments. Leadframe leads 108 in the illustrative embodiment are, by way of example, approximately 0.13 to 0.27 mm in width. Also, in accordance with the invention, a large pitch 110 exists between a pair of adjacent leadframe leads 108. The width of large pitch 110 may be determined by adding a combination of lead widths and pitches. When packaged integrated circuit 100 is mounted on a PWB, large pitch 110 permits high-speed lines to be routed between this pair of adjacent leadframe leads 108, providing access to additional leads 106 on an underside of packaged integrated circuit 100.

In the present embodiment a single large pitch 110 is shown. However, multiple large pitches 110 may exist along the perimeter of packaged integrated circuit 100. The number and placement of large pitches 110 along the perimeter of packaged integrated circuit 100 may correspond to the number and placement of additional leads 106 surrounding die 102 on the underside of package body 104.

Large pitch 110 is preferably disposed at the nearest point along the perimeter of packaged integrated circuit 100 from additional leads 106. Thus, large pitch 110 may be disposed along any side of packaged integrated circuit 100.

Referring now to FIG. 2A, a diagram illustrates a partial view of a leadframe 200 for a packaged integrated circuit 100, according to an embodiment of the present invention. Leadframe 200 shows leadframe leads 208 before they are trimmed and formed, before connection to die 102, and before encapsulating material is applied. A locking mechanism 212 is disposed at a specific point along the perimeter of leadframe 200, and in place of at least one leadframe lead 208. Locking mechanism 212, in the illustrative embodiment, creates a large pitch between two neighboring leadframe leads 208. Large pitch 210 is greater than the pitch between the remaining pairs of leadframe leads 208. The width of large pitch 210 is determined by the number of leadframe leads 208 locking mechanism 212 replaces. The present embodiment shows locking mechanism 212 replacing two leadframe leads 208. Therefore, the width of large pitch 210 may be determined by the equation:

$$LP = wx + p(x+1)$$

where LP represents the large pitch, w represents the width of leadframe leads 208, p represents the pitch between leadframe leads 208, and x represents the number of leadframe leads 208 replaced by locking mechanism 212.

Figure 2B:
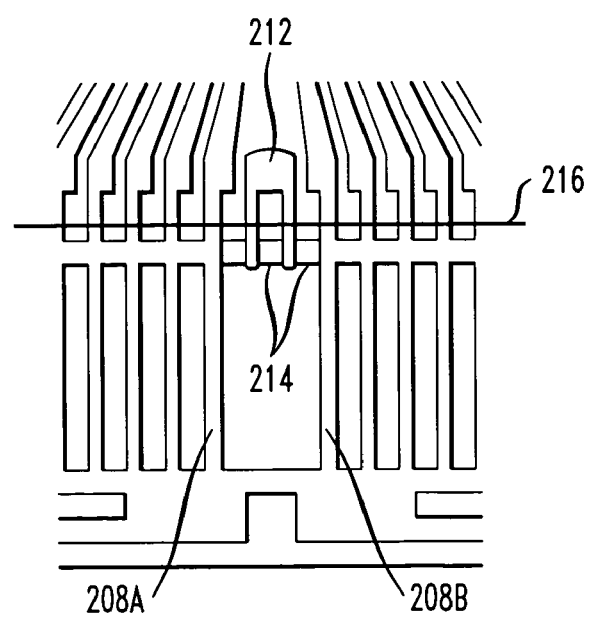
FIG. 2B is a diagram illustrating a magnified view of the leadframe of FIG. 2A showing a locking mechanism, according to an embodiment of the present invention.

Referring now to FIG. 2B, a diagram illustrates a magnified view of leadframe 200 of FIG. 2A showing locking mechanism 212, according to an embodiment of the present invention. Locking mechanism 212 is connected to leadframe 200 and leadframe leads 208A and 208B by dambar 214. Dambar 214 represents the individual sections of leadframe between leadframe leads 208 and locking mechanism 212. Locking mechanism 212 and dambar 214 keep leadframe 200 stable during manufacturing in place of the depopulated leadframe leads replaced by locking mechanism 212. Therefore, the manufacturing process of leadframe 200 does not require existing manufacturing equipment to be changed.

During manufacturing, after leadframe 200 is wirebonded to the die, encapsulant material is formed over leadframe 200 to form package body 104. Dambar 214 is a portion of leadframe 200 that prevents encapsulating material from flowing to the ends of leadframe 200, thus forming perimeter 216 of package body 104 and permitting portions of leadframe leads 208 to remain exposed. Locking mechanism 212 is partially covered by the encapsulating material leaving only a small extension of its legs exposed beyond perimeter 216. This small exposure of the legs of locking mechanism 212 is not shown, but each exposed leg represents where a leadframe lead would normally protrude from package body 104. Leadframe leads 208 are then trimmed and formed and portions of dambar 214 between each leadframe lead 208 and leg of locking mechanism 212 are punched out. The horseshoe shape of locking mechanism 212 prevents it from being pulled out during the trimming and forming of leadframe leads 208 and the removal of dambar 214. If locking mechanism 212 were to be pulled out it would result in holes in package body 104 on a perimeter 216 of the packaged integrated circuit.

Locking mechanism 212 may take other shapes. For example, in accordance with the current embodiment, if locking mechanism 212 were to replace an additional leadframe lead 208, locking mechanism 212 would comprise three prongs, forming an M-shape. While the present embodiment shows locking mechanism 212 having a shape with prongs, different forms are also possible that achieve the same result.

Figure 3:
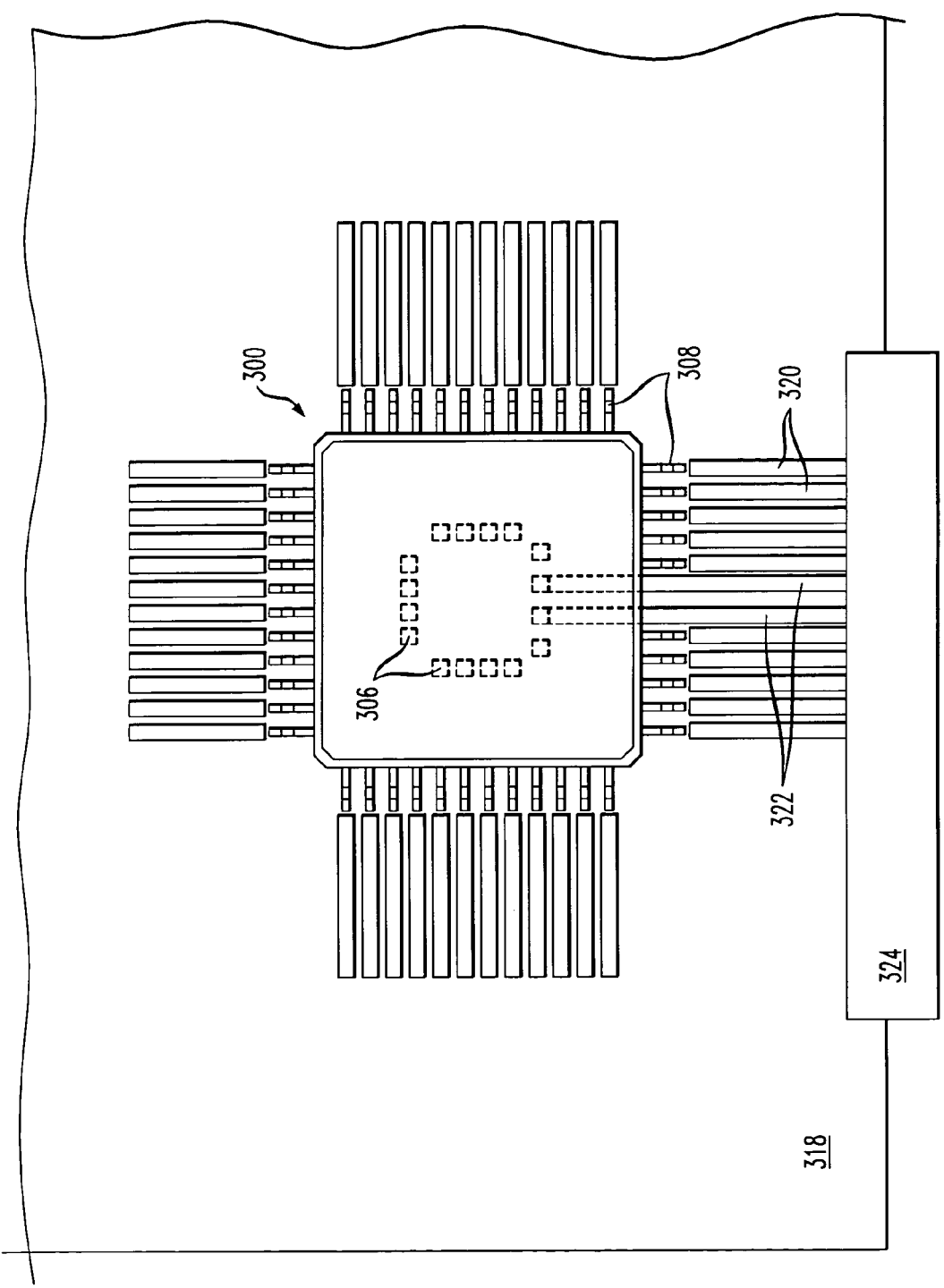
FIG. 3 is a diagram illustrating a top view of a PWB having a packaged integrated circuit mounted thereon, according to an embodiment of the present invention.

Referring now to FIG. 3, a diagram illustrates a top view of a PWB 318 having mounted thereon a packaged integrated circuit 300, according to an embodiment of the present invention. Leadframe leads 308 of packaged integrated circuit 300 are soldered to corresponding traces 320 on PWB 318. Traces 320 are routed on a top surface of PWB 318 from a connector 324 to leadframe leads 308. High-speed traces 322 may be routed on the top surface of PWB 318 from connector 324 through a large pitch, beneath packaged integrated circuit 300, to additional leads 306 on an underside of packaged integrated circuit 300. Critical signals may be routed through high-speed traces 322 on the top surface of PWB 318, while less critical signals may be routed through leadframe leads 308 or in lower layers of PWB 318. For example, lower-speed data and control signals may be carried by leadframe leads 308 and traces 320, while additional leads 306 and high-speed traces 322 may carry higher-speed signals, such as signals having a frequency of at least 2 GHz.

Packaged integrated circuit 300 may be disposed anywhere on PWB 318. The present embodiment shows a single packaged integrated circuit 300 on PWB 318, however a plurality of packaged integrated circuits 300 may be disposed thereon. Further, the present invention shows a single connector 324 on PWB 318, however, a plurality of connectors 324 may be disposed thereon. Connectors 324 may also be disposed in a multitude of positions on PWB 318. The present embodiment shows traces 320 and 322 taking specific paths from connectors 324 to packaged integrated circuit 300, however, traces 320 and 322 can take any path on PWB 318 to reach their destination. Traces 320 and 322 are shown to be routed on a top surface of PWB 318, which is preferred for high-speed traces 322. However, traces 320 and 322 may also be routed on a different layer of PWB 318. FIG. 3 shows packaged integrated circuit 300 having a plurality of additional leads 306 and leadframe leads 308. As described above, additional leads 306 and leadframe leads 308 may vary in number and placement in packaged integrated circuit 300. Finally, FIG. 3 shows an embodiment of the present invention on a PWB, however, it is also possible to mount the present invention on other circuit mounting structures.

Accordingly, as described herein, the present invention in the illustrative embodiment provides a high-speed packaged integrated circuit for installation on a PWB or other type of circuit mounting structure. More particularly, the present invention provides an improved packaged integrated circuit that allows for routing of high-speed traces on the top surface of the PWB from high-speed leads to a high-speed connector.

Although illustrative embodiments of the present invention have been described herein with reference to the accompanying drawings, it is to be understood that the invention is not limited to those precise embodiments, and that various other changes and modification may be made by one skilled in the art without departing from the scope or spirit of the invention.

What is claimed is:

1. A packaged integrated circuit comprising:
    a die;
    a package body formed from encapsulant, at least partially enclosing the die;
    a leadframe connected to the die and at least partially enclosed within the package body, and having leads extending from the package body, a subset of the leads of the leadframe being separated by a lead-to-lead pitch, wherein at least two adjacent leads of the leadframe are separated by a space larger than the pitch; and
    at least one additional lead connected to the die and exposed adjacent to the die on an interior underside of the package body for connection to a circuit mounting structure trace passing between the adjacent leads separated by the space larger than the pitch.

2. The packaged integrated circuit of claim 1, wherein the at least one additional lead is substantially flush with the underside of the package body.

3. The packaged integrated circuit of claim 1, wherein the at least one additional lead is disposed on a side of the die on the underside of the package body closest to the space larger than pitch.

4. The packaged integrated circuit of claim 1, wherein at least one additional lead is disposed on each side of the die on the underside of the package body.

5. The packaged integrated circuit of claim 4, wherein a space larger than the pitch is disposed between two adjacent leads on each side of the package body.

6. The packaged integrated circuit of claim 1, wherein the packaged integrated circuit is configured as a Thin Quad Flat Package (TQFP).

7. The packaged integrated circuit of claim 1, wherein a die pad of the die is exposed on the underside of the packaged integrated circuit.

8. The packaged integrated circuit of claim 1, wherein the leads in the subset of leads separated by the lead-to-lead pitch of the leadframe are configured for carrying data and control signals.

9. The packaged integrated circuit of claim 1, wherein the at least one additional lead is configured for carrying a signal having a frequency of at least 2 GHz.

10. The packaged integrated circuit of claim 1, wherein the lead-to-lead pitch is approximately 0.4 mm wide.

11. The packaged integrated circuit of claim 1, wherein each lead of the leadframe is approximately 0.2 mm wide.

12. The packaged integrated circuit of claim 1, wherein the space larger than the pitch is determined by the equation, $LP=wx+p(x+1)$, wherein LP represents the space larger than pitch, w represents a width of the leadframe leads, p represents the lead-to-lead pitch, and x represents the number of leadframe leads removed to form the space larger than pitch.

13. The packaged integrated circuit of claim 1, wherein the die comprises an integrated circuit device.

14. The packaged integrated circuit of claim 1, wherein the at least one additional lead is wire bonded to the die within the package body.

15. A packaged integrated circuit comprising:
a die;
a package body formed from encapsulant, at least partially enclosing the die;
a leadframe connected to the die and at least partially enclosed within the package body, and having leads extending from the package body, a subset of the leads of the leadframe being separated by a lead-to-lead pitch, wherein at least two adjacent leads of the leadframe are separated by a space larger than the pitch; and
at least one additional lead connected to the die and disposed on an underside of the package body, the at least one additional lead being connectable to a circuit mounting structure trace passing between the adjacent leads separated by the space larger than the pitch, wherein the at least one additional lead is wire bonded to the die within the package body.

16. A leadframe of for use in a packaged integrated circuit, comprising:
a plurality of leads, a subset of the leads being separated by a lead-to-lead pitch, wherein at least two adjacent leads are separated by a space larger than the pitch, allowing a circuit mounting structure trace to pass through the space larger than the pitch when the leadframe is in use in a packaged integrated circuit having a package body which at least partially encloses the leadframe, so that the trace is connectable to an additional lead exposed adjacent to a die on an interior underside of the package body.

17. The leadframe of claim 16, further comprising at least one locking mechanism coupled between the adjacent leads having the space larger than the pitch therebetween, the locking mechanism being configured to maintain the space larger than the pitch.

18. The leadframe of claim 17, wherein the locking mechanism is at least partially enclosed within the package body.

19. The leadframe of claim 17, wherein the locking mechanism is U-shaped having a central portion arranged within the package body and first and second legs each extending toward a perimeter of the package body when the leadframe is used in a packaged integrated circuit.

20. A circuit mounting structure comprising at least one electrical connector, a plurality of traces, and at least one packaged integrated circuit mounted thereon, the packaged integrated circuit comprising:
a die;
a package body formed from encapsulant, at least partially enclosing the die;
a leadframe connected to the die and at least partially enclosed within the package body, and having leads extending from the package body, a subset of the leads of the leadframe being separated by a lead-to-lead pitch, wherein at least two adjacent leads of the leadframe are separated by a space larger than the pitch; and
at least one additional lead connected to the die and exposed adjacent to the die on an interior underside of the package body for connection to a trace of the circuit mounting structure routed from the at least one electrical connector and passing between the adjacent leads separated by the space larger than the pitch.

* * * * *